United States Patent [19]
Eastburn

[11] Patent Number: 5,883,905
[45] Date of Patent: Mar. 16, 1999

[54] PATTERN GENERATOR WITH EXTENDED REGISTER PROGRAMMING

[75] Inventor: Martin H. Eastburn, Felton, Calif.

[73] Assignee: Schlumberger Technologies, Inc., San Jose, Calif.

[21] Appl. No.: 801,687

[22] Filed: Feb. 18, 1997

[51] Int. Cl.[6] .................................................. G01R 31/28
[52] U.S. Cl. ..................... 371/27.1; 395/183.08
[58] Field of Search .................. 371/27.1, 21.1, 371/21.6, 22.31, 22.6, 27.2, 22.35, 27.7, 27.5; 395/421.07, 421.08, 182.01, 183.15, 183.07, 183.08, 183.16; 364/481, 579, 580, 717, 489; 324/765, 763

[56] References Cited

U.S. PATENT DOCUMENTS

| | | | |
|---|---|---|---|
| 4,293,950 | 10/1981 | Shimizu et al. | 371/21 |
| 4,313,200 | 1/1982 | Nishiura | 371/25 |
| 4,682,330 | 7/1987 | Millham | 371/20 |
| 4,862,460 | 8/1989 | Yamaguchi | 371/27 |
| 4,931,723 | 6/1990 | Jeffrey et al. | 371/22.3 |
| 5,151,903 | 9/1992 | Mydill et al. | 371/27 |
| 5,499,248 | 3/1996 | Behrens et al. | 371/22.1 |
| 5,682,393 | 10/1997 | Ohsawa | 371/27 |

OTHER PUBLICATIONS

Schlumberger S92 Programming Manual, 1991, P/N 57510101, Rev. 2.
MTS Operation & Programming TPC XXV, 1983, P/N 371667, Rev. B.

*Primary Examiner*—Robert W. Beausoliel, Jr.
*Assistant Examiner*—Nadeem Iqbal
*Attorney, Agent, or Firm*—Fish & Richardson P.C.

[57] ABSTRACT

An algorithmic pattern generator (APG) having extended register programming capability for use in a circuit tester. The APG is programmable to drive a subroutine memory in a tester. The APG may include a sequencer with paired loop counters, address generators having address and reference registers each paired with indexing registers, a data generator providing bit inversion with a latched inversion register, a topology memory, or a delayed access pipeline for data synchronization. The APG may also include a two stage address scrambler combining a crosspoint multiplexer and scrambler RAM.

18 Claims, 7 Drawing Sheets

PATTERN GENERATOR WITH EXTENDED REGISTER PROGRAMMING

This application makes reference to co-pending, commonly-owned U.S. patent application Ser. No. 08/762, 611, filed Dec. 9, 1996, entitled "Memory Tester APG With Flexible Z Register Programming", the disclosures of which are incorporated here by this reference in their entirety.

BACKGROUND

The present invention relates to algorithmic pattern generators in automatic test equipment for testing circuits, and more particularly to algorithmic pattern generators useful for testing semiconductor random access memory arrays embedded in logic and semiconductor random access memory devices, and more particularly for testing synchronous DRAM devices.

Automatic pattern generators (APGs) are well-known components of automatic test equipment (ATE) for electronic circuits. APGs exist to create patterns of test vectors on-the-fly for testing integrated circuits. The testing of memory arrays (embedded in logic or microprocessor devices, for example) and memory devices (such as synchronous dynamic random access memory devices) is an important application of APGs. New memory devices are faster and larger than previous generation devices. They also pose new challenges to the algorithmic generation of test vectors—multi-cycle latency, pipelining, non-linear address sequencing, and synchronous operation.

SUMMARY

Figure 1:
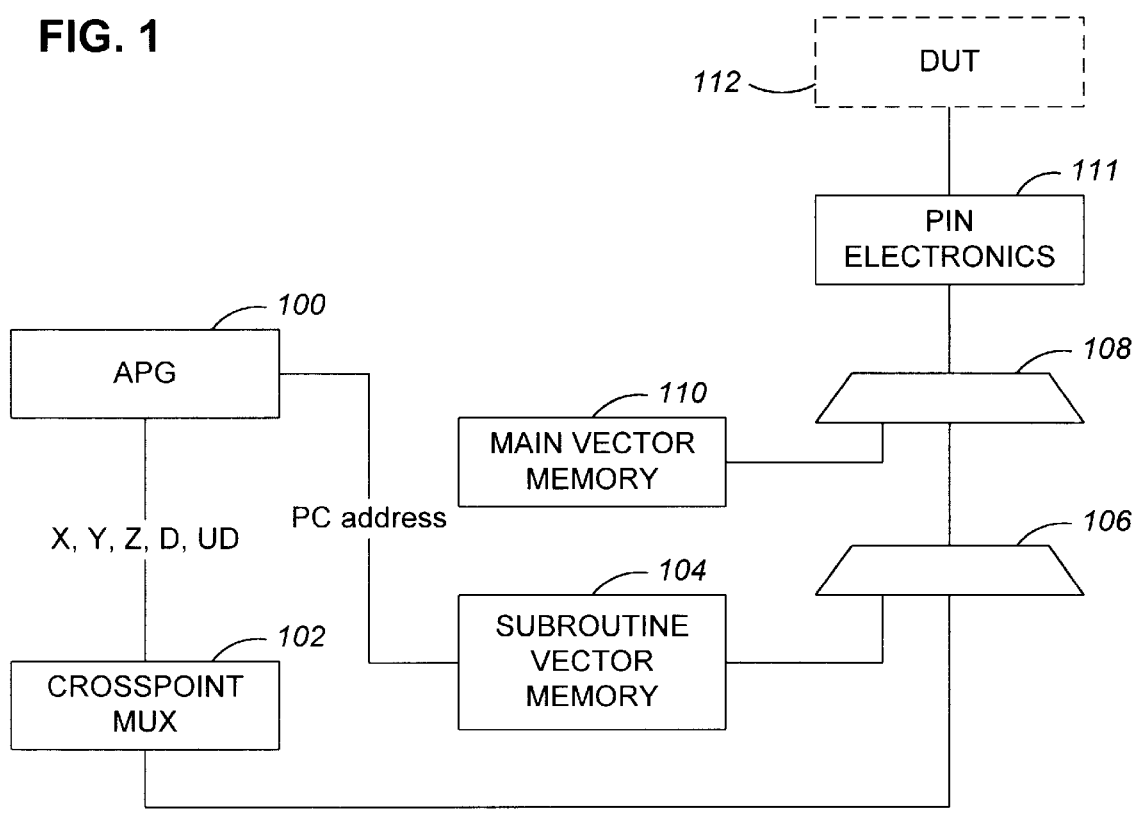
FIG. 1 is a block diagram of an algorithmic pattern generator (APG) in accordance with the present invention in a context of other components of a tester.

In general, in one aspect, the invention features an algorithmic pattern generator (APG) in a circuit tester for testing circuits, the circuit tester being of a kind having a main vector memory and a subroutine vector memory for storing test vectors. The APG includes a programmable sequencer operating to select instructions for execution by the APG, the sequencer including: a program counter storing a program counter address and sequence control logic coupled to the program counter to receive the program counter address. The sequence control logic operates in response to sequence control instructions to select a next address and to cause the next address to be stored in the program counter. The APG also includes an instruction memory coupled to receive the program counter addresses from the program counter and coupled to the sequence control logic, with the instruction memory storing sequence control instructions and operating to provide sequence control instructions to the sequence control logic in response to the program counter address. The instruction memory further stores pattern instructions and operates to provide pattern instructions to the APG in response to the program counter address. The APG further includes an address generator and a data generator. The address generator is coupled to receive pattern instructions from the instruction memory and operates to generate X address signals and Y address signals in response to received pattern instructions. The data generator is coupled to receive signals from the address generator and pattern instructions from the instruction memory, and operates to generate data signals in response to received array signals and pattern instructions. The program counter is coupled to drive a subroutine vector memory control circuit in the circuit tester and operates to provide the program counter address to control operation of the subroutine vector memory.

In general, in another aspect, the invention features, in an algorithmic pattern generator, a programmable sequencer which includes a pair of linked loop counters including a first loop counter and second loop counter; a program counter storing a program counter address; and sequence control logic coupled to the program counter to receive the program counter address. The sequence control logic operates in response to sequence control instructions and includes logic to: execute a sequence control instruction to program a first initial value for the first loop counter; execute a sequence control instruction to program a second initial value for the second loop counter; and execute a sequence control instruction to loop to a target program counter address until the pair of linked loop counters is exhausted, wherein the pair counts as a cascaded counter pair with each loop counter running from the counter's programmable initial value to a final value.

In general, in another aspect, the invention features in an algorithmic pattern generator an address generator including registers operating to store Y-related values that include a Y register and a YI register with the YI register operating as an index register to the Y register. The address generator also includes a YREF register and a YRI register with the YRI register operating as an index register to the YREF register, a YMAX register; and a YOFF register. The address generator further includes Y address circuitry coupled to the Y, YI, YREF, YRI, YMAX and YOFF registers which operates to perform arithmetic and logical operations on the Y, YI, YREF, YRI registers, the result of each operation being masked by the YMAX value from the YMAX register before being stored in the Y, YI, YREF, or YRI registers. The address generator further includes a YOFF adder coupled to the YOFF register and the Y register which operates to compute the Y address as the sum of the YOFF value and the Y value.

In general, in another aspect, the invention features in an algorithmic pattern generator, a programmable sequencer which includes a program counter for storing a program counter address and sequence control logic coupled to the program counter to receive the program counter addresses. The sequence control logic operates in response to sequence control instructions to select a next address and to cause the next address to be stored in the program counter. The sequencer also includes instruction memory coupled to receive the program counter addresses from the program counter and coupled to the sequence control logic. The instruction memory stores sequence control instructions and operates to provide sequence control instructions to the sequence control logic in response to the program counter address. The sequencer further includes a refresh circuit coupled to the sequence control logic which operates to generate a refresh interrupt signal at a timed interval and to provide the refresh interrupt signal to the sequence control logic. The sequence control logic operates to call a refresh subroutine in the instruction memory in response to the refresh interrupt signal.

In general, in another aspect, the invention features, in an algorithmic pattern generator, a data generator which includes a first stage circuit connected to receive as input address signals and operates to produce an invert value. The data generator also includes a crosspoint multiplexer circuit connected to receive as input address signals a number M of address signals and operates to produce as outputs output address signals being a selection of a smaller number m of the input address signals. The address generator further includes a topology memory connected to be addressed by the selection of m signals produced as output by the crosspoint multiplexer circuit and produces a topology invert bit as output, and includes a sequence of stages through which the invert value passes serially. An input to the sequence is the output of the first stage circuit, and the sequence includes as one stage a data inversion gate connected to the topology memory to receive the topology invert bit and operates to invert the invert value according to the state of the topology invert bit.

Among the advantages of the invention are one or more of the following. It can generate complex memory array test patterns from small pattern programs. Small pattern programs can replace massive test vector files, saving disk storage, load time for loading tester programs, and tester vector memory, and enhancing the quality of testing through ease of test pattern generation.

It provide a powerful pattern architecture for generating address complement, checkerboard, galpat, rc_galpat, butterfly, moving inversion, data decoders, march and other tests.

Other features and advantages will become apparent from the following description and from the claims.

DETAILED DESCRIPTION

Referring to FIG. 1, an algorithmic test pattern generator (APG) 100 is programmed and run to generate pattern signals X, Y, Z, D, and UD. Because APGs are typically and advantageously used in the testing of memory arrays, these signals conventionally are thought of, and used as, an X and Y device address for a memory location, a Z device address or segment, a delayed data value for the location, and an un-delayed data value for the location, respectively. The X and Y device addresses to a memory array are conventionally the row and column addresses, respectively. The widths of these signals in an embodiment useful for present memory devices (arrays up to 64 Mbit in size) are 16 bits for X and Y, 4 bits for Z, and 22 bits for D and UD combined.

Use of the APG 100 is not limited to testing memory arrays. It functions generally as an alternative source of test vector data for use in a circuit tester. In tester operation, the bits of a test vector are ultimately routed to pin electronics 111, where they may be used to define signals applied to pins of a DUT (device under test) 112, and/or to define a comparison for signals received from pins of a DUT and/or to provide control signals to the pin electronics 111. As is illustrated conceptually with selectors 106 and 108, the control circuitry of a tester will cause the test vector bit or bits for a particular pin of a DUT to be taken from a main test vector memory 110, a subroutine test vector memory 104, or an APG 100. To match the output signal lines of the APG to the pins of the DUT, the APG is coupled to the tester through a crosspoint multiplexer 102 that is programmable to cross connect any of the crosspoint inputs to any of its outputs. This allows full flexibility of programming to connect cell row and column device address bits, for example, to any pins on a DUT. The APG 100 also provides a PC (program counter) address signal, which may be used to drive the subroutine vector memory 104, as will be described below.

Figure 2:
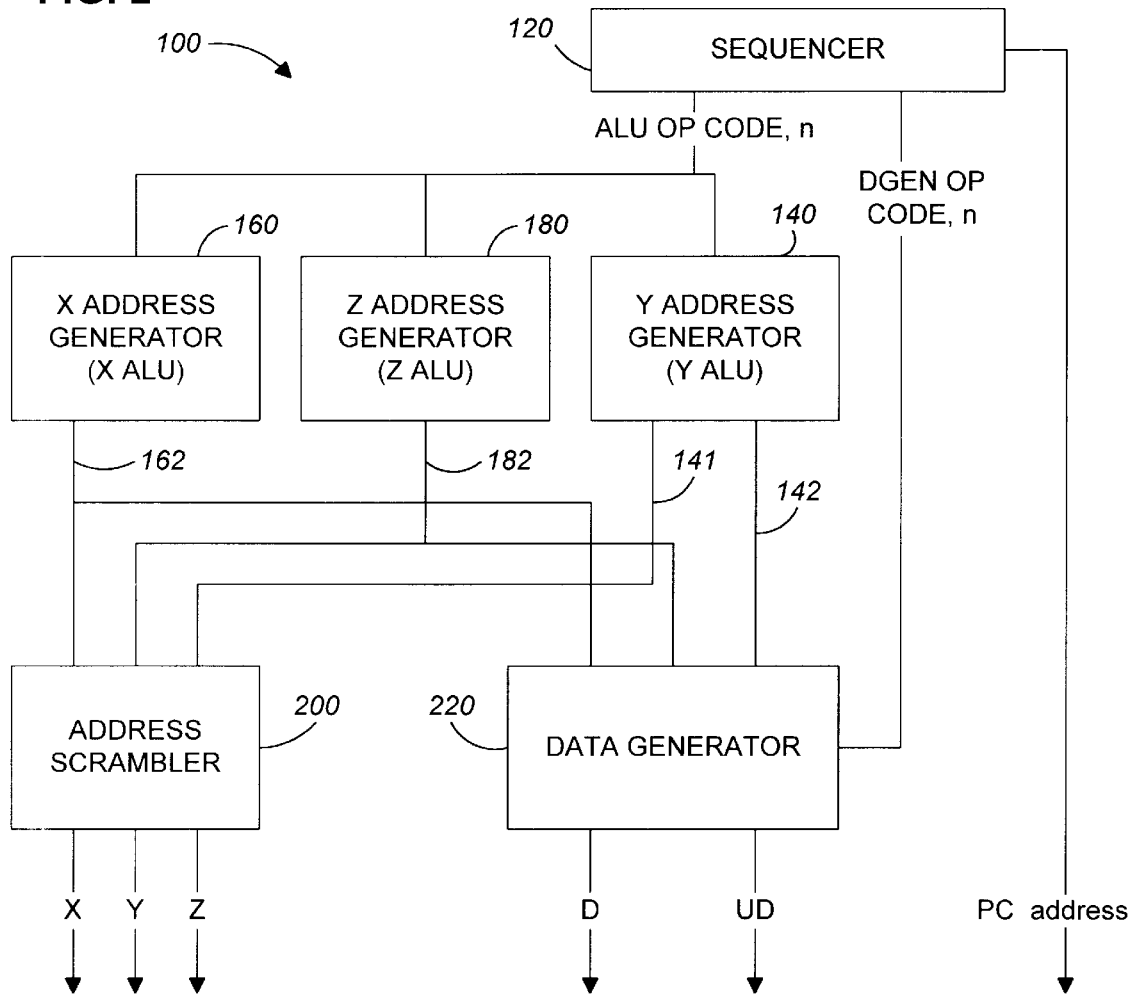
FIG. 2 is a block diagram of an APG in accordance with the present invention.

Referring to FIG. 2, the APG 100 includes a programmable sequencer 120 that selects instructions for execution by the APG; an address generator including X, Y, and Z address generators, namely arithmetic logic units (ALUs) X ALU 160, Y ALU 140, and Z ALU 180; an address scrambler 200; and a data generator 220. On each APG instruction cycle (i.e., for each pattern vector to be generated) the sequencer 120 sends an ALU op code and operand (denoted "n") to the ALUs 140, 160, and 180 through signal lines. The sequencer 120 also sends a data generator (DGEN) op code and operand to the data generator 220 through signal lines. In turn, the X, Y, and Z ALUs 160, 140, and 180 provide X address, Y address and Z address output signals through signal lines 162, 141, and 182, respectively, to the address scrambler 200, which may rearrange the signals and subject them to Boolean operations to produce the X, Y, and Z device address signal outputs of the APG. The ALUs and also provide signals to the data generator 220, which generates the D and UD output signals. The X and Y ALUs also receive signals from others of the X, Y, and Z ALUs to support the ALU instructions described below. Parenthetically, it will be noted that the figures here are simplified and conceptual so as to present a clear picture of the features of the invention. For example, the figures do not show the pipeline structure of the APG used to achieve high speed in a production implementation. Also, the width of signal buses is generally not indicated, it being understood that a drawn signal line indicates a bus of sufficient capacity to carry the required signals to the next stage for processing or use.

Figure 3:
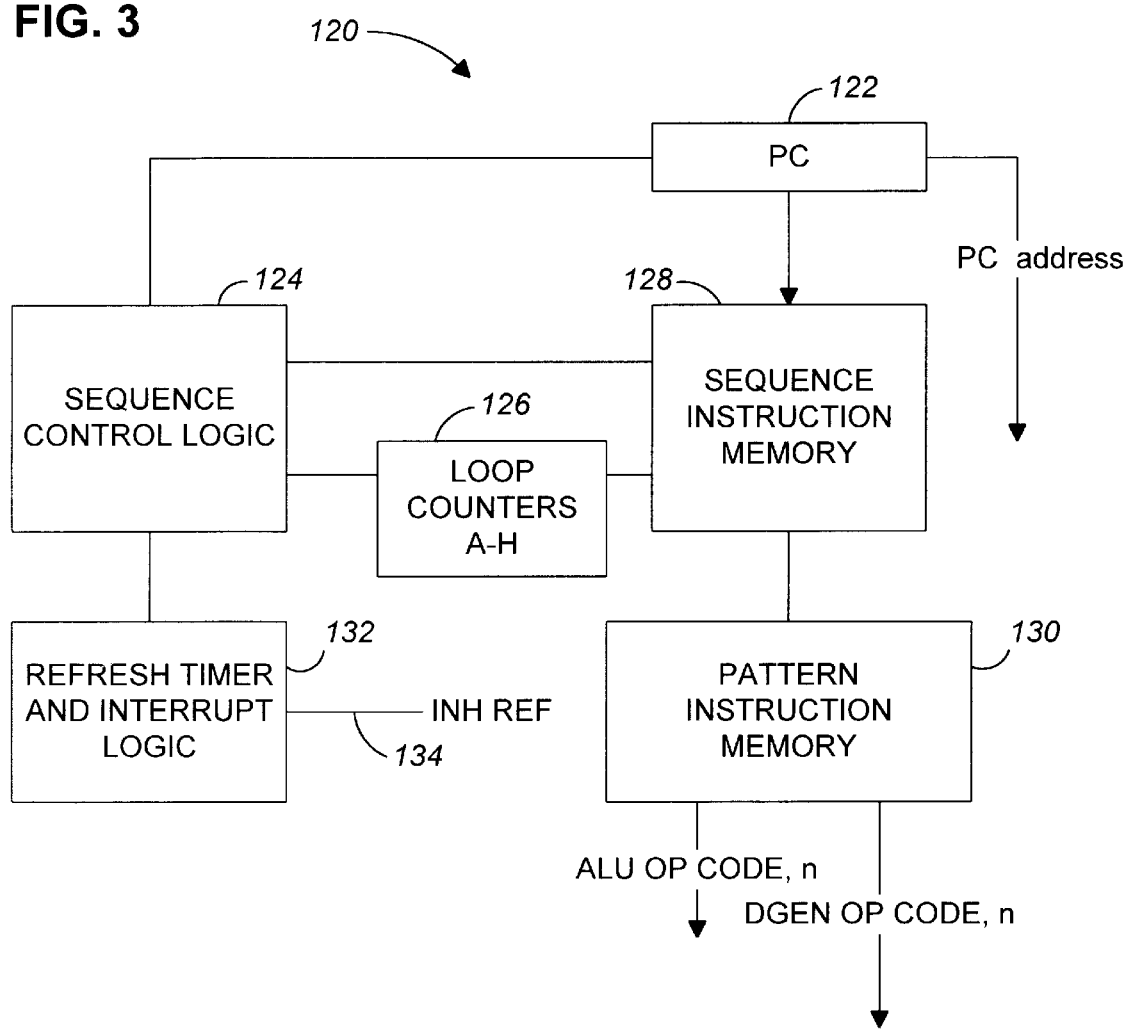
FIG. 3 is a block diagram of a sequencer of the APG.

Referring to FIG. 3, when the APG is executing a pattern (a program in the APG's pattern language instruction set), it performs, at each instruction cycle, the instruction pointed to (directly or indirectly) by PC 122 (the PC address). The PC address addresses the sequence instruction memory 128. In response to the program counter address, the sequence instruction memory 128 provides a sequence control instruction such as JUMP or LOOP and other data to the control logic 124, provides the n operand and provides a pattern instruction memory address to address the pattern instruction memory 130. Based on the sequence control instruction and other data it receives, the control logic 124 calculates (selects) the PC address for the next APG instruction cycle and stores it in the PC 122. The signals to the pattern instruction memory 130 result in output of an ALU op code to the ALUs (140, 160, and 180) and a DGEN op code to the data generator 220, respectively. The sequence and pattern instruction memories are loaded at APG setup time, before execution of an APG program begins.

A block 126 of at least eight loop counters A–H supports conditional branch (loop) instructions. At least two pairs of counters, EF and GH, can operate in a linked way, as will be described.

Sequence instructions supported by the APG include those in the following table.

| | |
|---|---|
| ADVANCE | Advance to next instruction |
| JUMP | Jump to specified location |
| CALL | Jump to specified location, push (PC address) + 1 |
| HALT | End of APG program |
| RET | Return from a call (i.e., pop stack and load PC) |
| CNT_c = n | Set initial value of counter c to n; c is one of A, B, C, D, E, F, G, or H |
| LOOP_c | Test counter: branch and decrement if not zero, reset counter to initial value if zero. Loop when counter c not zero; c is one of A, B, C, D, E, F, G, H, EF, or GH |

There is a loop instruction for each counter A–H and for each of the linked pairs EF and GH.

Instructions to loop to a target address until a loop counter is exhausted operate to test the loop counter and (i) if the loop counter is not zero, jump to the target address and decrement the loop counter, and (ii) if the loop counter is zero, reset the loop counter to its initial value and advance to the next instruction.

In the paired-loop (LOOP_EF and LOOP_GH) instructions, the E and G counters are the low order counters. In these instructions, the counters are cascaded in the sense that the low order counters count around to their initial value—set, for example, by a CNT_E=12 instruction—and not to the maximum value the counters will hold. This allows the paired-loop counters to be used easily to program loops that correspond to an array, by setting the initial counter values to the dimensions of the array. Counters can be initialized to any value and are not limited, for example, to a power of two.

The sequencer 120 has refresh timer and interrupt logic 132 coupled to the sequence control logic 124 that can be used to invoke an interrupt subroutine. The timer and interrupt logic 132 have a refresh count hold register and a refresh branch address register, which are initialized at setup time.

The branch address register contains the address of an interrupt subroutine to which the sequencer passes control when an interrupt occurs. The refresh counter has a terminal for receiving a clocking signal and operates to count from an initial value to a final value in response to the clocking signal and to generate the refresh interrupt signal when a final value, for example, zero, is reached. The refresh counter starts as soon as the APG starts. The interrupt signal is provided to the sequence control logic 124, and, if the current APG instruction cycle does not have a refresh-holdoff bit set (providing inhibit refresh signal 134), the sequencer calls the interrupt subroutine. When a return instruction is reached, control will return and the refresh counter will reload and start counting down again.

The refresh logic 132 forcing a subroutine call can be used for many unique test types other than refresh. For example, a "disturb" pattern can be programmed where, after a length of time, the array under test is read in a unique way, is subject to a power surge, or has a series of measurements taken in a somewhat asynchronous mode.

Figure 4:
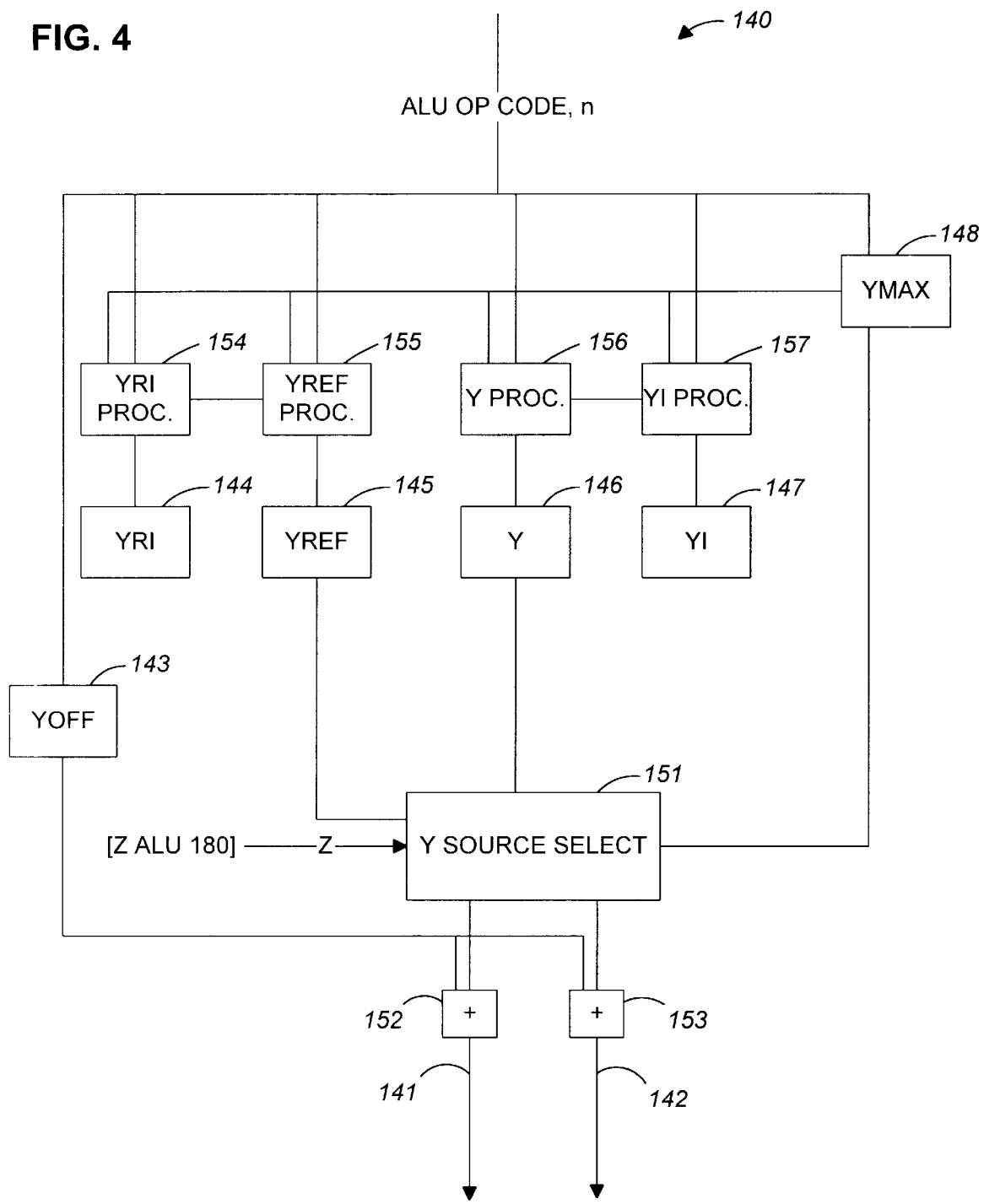
FIG. 4 is a block diagram of a Y address generator of the APG.

Referring to FIG. 4, the Y ALU 140 includes registers YOFF 143, YRI 144, YREF 145, Y 146, YI 147, and YMAX 148, which are used in address calculation operations. YMAX is a bounding register whose value masks values before they are stored in registers Y, YI, YREF, and YREF. YOFF is an offset register that will be described below. YRI and YREF act as a pair and Y and YI act as a pair. YRI contains index values for reference values in the YREF register. YI contains index values for the Y address values in the Y register. The YRI 144, YREF 145, Y 146, and YI 147 registers have corresponding instruction processors 154, 155, 156, and 157, which functionally relate the members of the above register pairs. The instruction processors perform arithmetic and logical operations on the corresponding registers, including the operations listed in the following table in response to instruction control bits received from pattern instructions.

| YRI Operations: | |
|---|---|
| YRI = n | Set YRI to n |
| INCYRI | Increment YRI value |
| INCYRI | Decrement YRI value |
| YREF Operations: | |
| YREF = n | Set YREF to n |
| YREF = Y | Set YREF to Y |
| YREF += YRI | Increment YREF by value in YRI |
| YREF -= YRI | Decrement YREF by value in YRI |
| YI Operations: | |
| YI = n | Set YI to n |
| INCYI | Increment YI value |
| DECYI | Decrement YI value |
| SLYI | Shift YI left 1 bit |
| SRYI | Shift YI right 1 bit |
| Y Operations: | |
| Y = n | Set Y to n |
| INCY | Increment Y value |
| DECY | Decrement Y value |
| Y += YI | Increment Y by value in YI |
| Y -= YI | Decrement Y by value in YI |
| INCY @ XCARRY | Increment Y at XCARRY true |
| DECY @ XCARRY | Decrement Y at XCARRY true |
| INCY @ ZCARRY | Increment Y at ZCARRY true |
| DECY @ ZCARRY | Decrement Y at ZCARRY true |
| Y = YREF | Set Y to YREF |

The Y ALU 140 receives from the Z ALU 180 a signal ZCARRY and from the X ALU 160 a signal XCARRY and supports instructions incrementing and decrementing the Y register 146 if ZCARRY and XCARRY are true, respectively.

The selection of Y address values to be the output (on lines 141 and 142) of the Y address generator 140 is performed by a Y source selector circuit 151, which operates under control of pattern instructions. The Y source selector is connected to the registers by signal lines and provides one of the values of Y, Y-inverted, or YREF as an input signal to an address side adder 152. On the other side which may be considered the DUT side, the Y source selector provides Y values that may have one or more bits from the Z register (received by signal line connection from Z ALU 180) substituted for low order bits of Y. (Operation of the Z ALU and use of the Z register in Y address programming is further described in the above-referenced U.S. patent application "Memory Tester APG with Flexible Z Register Programming".) The DUT side Y, Y-inverted, or YREF are similarly provided as input to a DUT side adder 153. The other input to the two adders 152 and 153 is YOFF from the YOFF register 143. The resulting values are always between YOFF and YOFF+YMAX. The sum from the address side adder 152 is provided on signal lines 141 to the address scrambler 200. The sum from the DUT side adder 153 is provided on signal lines 142 to the data generator 220.

Figure 5:
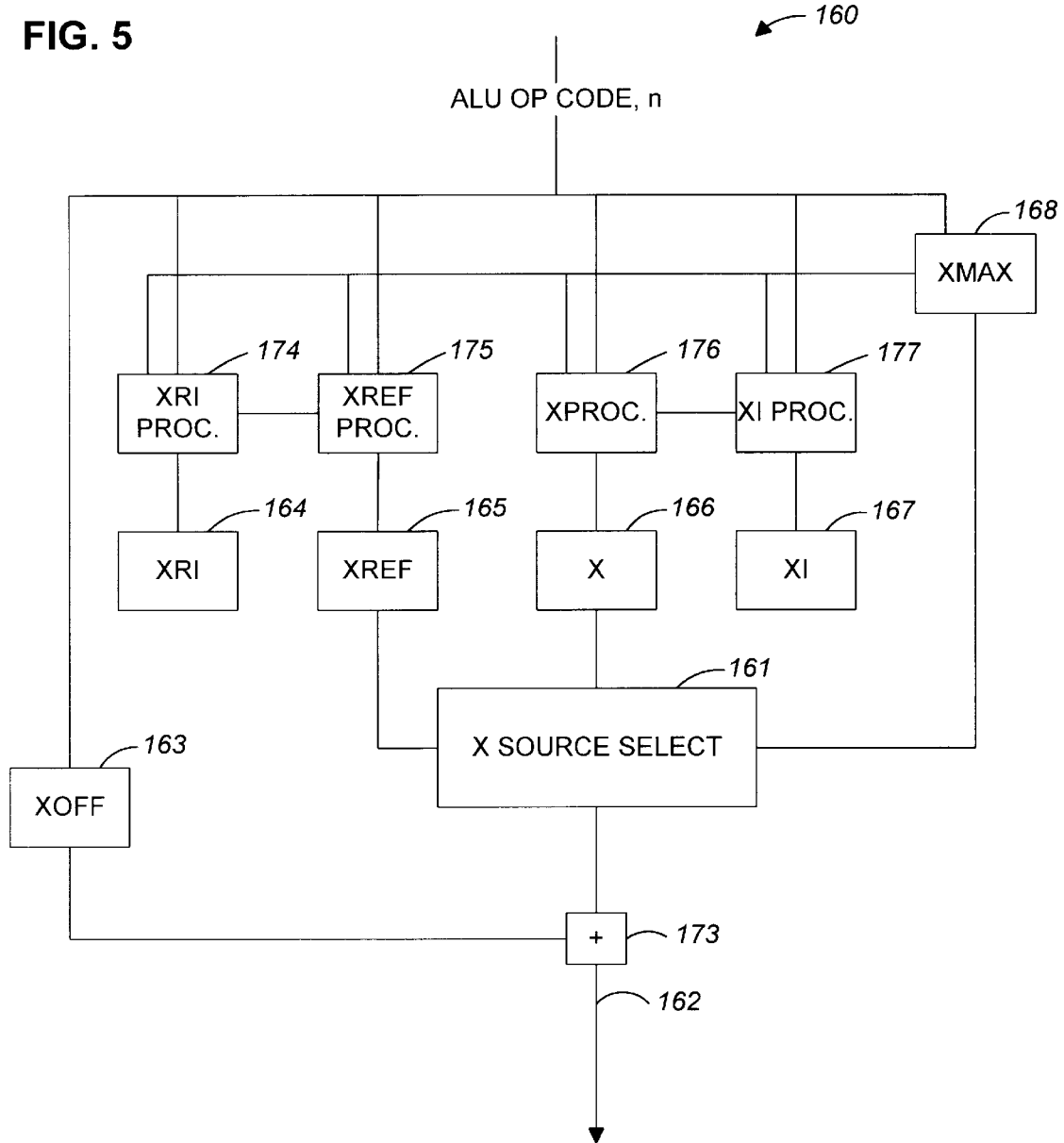
FIG. 5 is a block diagram of an X address generator of the APG.

Referring now to FIG. 5, the X ALU 160 (X address generator) has an architecture and functions analogous to the Y ALU 140, except there is no use of the Z register ALU 180 input to replace X bits and only one output as described below. The X ALU 160 includes registers XOFF 163, XRI 164, XREF 165, X 166, XI 167, and XMAX 168, and corresponding instruction processors 174, 175, 176, and 177, each of which are analogous to their Y ALU 140 counterparts.

Figure 6:
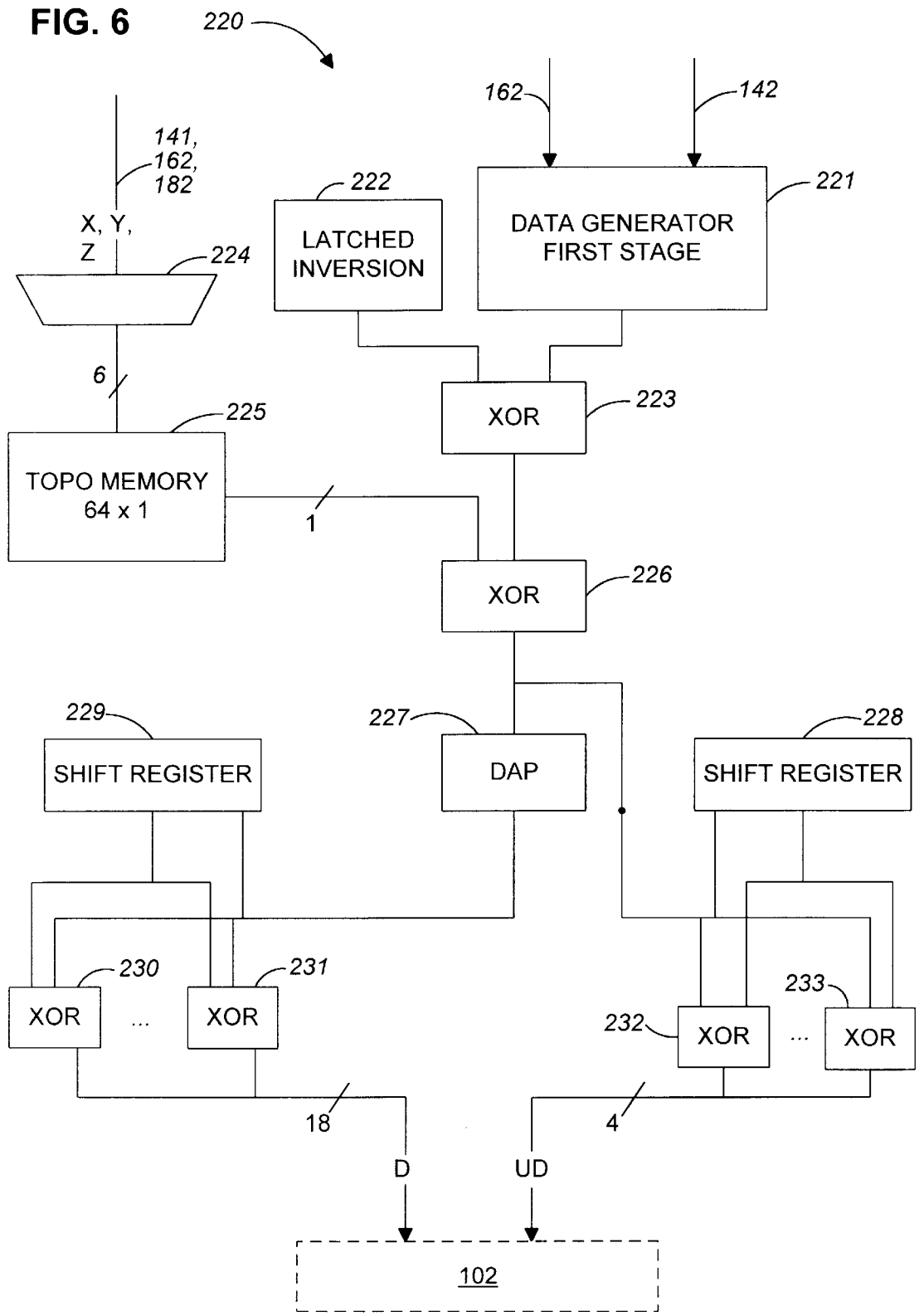
FIG. 6 is a block diagram of a data generator of the APG.

Referring to FIG. 6, the data generator 220 receives a data generator (DGEN) instruction from the pattern instruction memory 130; X, Y, and Z addresses from the X, Y, and Z ALUs; and an operand n. A first stage 221 receives X and Y address by way of signal lines 162 and 142. The first stage operates to produce an invert value (or bit) according to the pattern instruction and the inputs the first stage receives. This invert bit is the passed through (inverted or not) a sequence of inversion (exclusive or) stages, which include a latched inversion stage at gate 223 and a topology inversion stage at gate 226.

Latched inversion register 222 responds to pattern instructions to set and to clear the register and retains its state until a pattern instruction changes it. Gate 223 inverts the invert value or not according to the state of the latched inversion register 222. This allows for easy programming of a pattern and its inverse with the insertion of a single pattern instruction to change the state of the latch inversion register 222 between two calls to a pattern subroutine.

Topology inversion facilitates programming for devices that have a topology based inversion of physically stored data. A selector 224 receives as input a number M of address signals from the address generator and produces as output a selection of a smaller number m of these address signals. Thirty-six bits of X, Y, and Z address signals may be reduced to a six-bit topology address, for example, by selector 224. The m address signals output are used to address a topology memory 225 (a $2^m \times 1$ random access memory) to produce a topology inversion bit. Larger or smaller values of M and m can also be used.

The data generator 220 includes two shift registers 228 and 229 that are loaded by a single pattern instruction. A signal path provides the invert bit from the last of the inversion stages to control a set of inversion gates 230–231 and 232–233. The signals for shift register 229 and gates 230–231 pass through a delayed access pipeline (DAP) 227 and produce a delayed output (D) as will be described. Those routed to shift register 228 and gates 232–233 bypass the DAP. The shift registers 229 and 229 may be of any desired length, such as 16 or 18 bits, and may be programmed to rotate over fewer bits than their physical length.

The DAP 227 responds to pattern instructions to set a delay length, receives input data including the final invert value, and produces as output its input data delayed by a number of APG cycles equal to the delay length, which may range from zero to the number of stages in the pipeline. The input to the DAP includes a shift register control bit and the output of the DAP includes the shift register control bit delayed by the delay length. Thus, to produce the contents of the shift register, the invert value is programmed to zero. To produce a walking pattern, the invert bit is set to zero, one of the bits in the shift register is set to 1, and the shift control bit is set in the pattern instruction.

Figure 7:
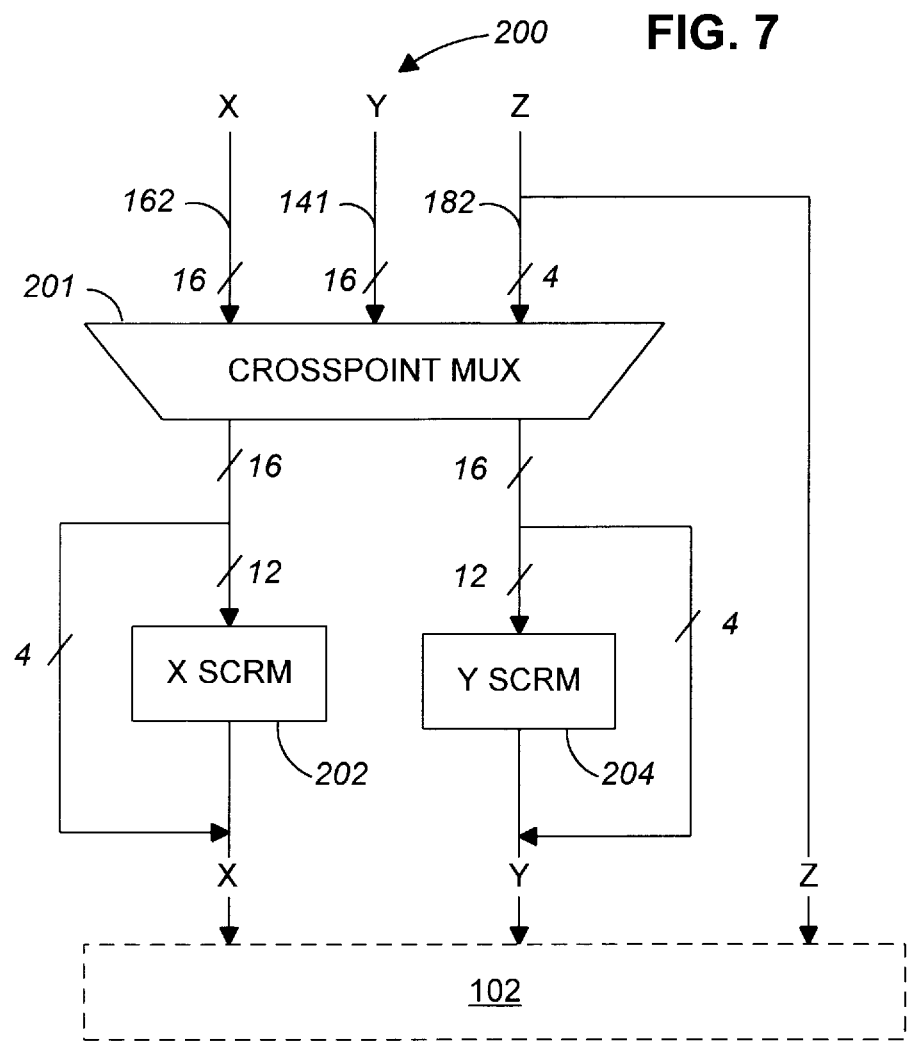
FIG. 7 is a block diagram of an address scrambler of the APG.

Referring to FIG. 7, the address scrambler 200 combines a crosspoint multiplexer 201 and a pair of scramble memories (XSCRM and YSCRM) 202 and 204. All three are initialized (programmed) at APG setup time. The multiplexer 201 receives X, Y, and Z addresses from the X, Y, and Z ALUs—as illustrated, 36 bits in all—and connects any 32 of them, one-to-one, to any of its 32 outputs, 16 of which become X address values and 16 of which become Y address values. The low-order 12 bits of the X and Y values are provided as addresses to XSCRM and YSCRM 202 and 204, respectively, which are 4K×12 random access memories. The scramble memories can be pre-programmed to implement any Boolean operation on their 12 bits of input. The remaining four bits pass directly to output. The scramble memories may be bypassed altogether by use of bypass multiplexers (not shown).

What is claimed is:

1. An algorithmic pattern generator (APG) in a circuit tester for testing circuits, the circuit tester being of a kind having a main vector memory and a subroutine vector memory for storing test vectors, the APG comprising:

a programmable sequencer operating to select instructions for execution by the APG, the sequencer including:
      a program counter storing a program counter address,
      sequence control logic coupled to the program counter to receive the program counter addresses, the sequence control logic operating in response to sequence control instructions to select a next address and to cause the next address to be stored in the program counter,
   instruction memory coupled to receive the program counter addresses from the program counter and coupled to the sequence control logic, the instruction memory storing sequence control instructions and operating to provide sequence control instructions to the sequence control logic in response to the program counter address, the instruction memory further storing pattern instructions and operating to provide pattern instructions to the APG in response to the program counter address;
   an address generator coupled to receive pattern instructions from the instruction memory, the address generator operating to generate X address signals and Y address signals in response to received pattern instructions; and
   a data generator coupled to receive signals from the address generator and pattern instructions from the instruction memory, the data generator operating to generate data signals in response to received array signals and pattern instructions;
   wherein the program counter is coupled to drive a subroutine vector memory control circuit in the circuit tester and operates to provide the program counter address to control operation of the subroutine vector memory.

2. An algorithmic pattern generator (APG) in a circuit tester for testing circuits, the circuit tester being of a kind having a main vector memory and a subroutine vector memory for storing test vectors, the APG comprising:

a programmable sequencer operating to select instructions for execution by the APG, the sequencer including:
      a program counter storing a program counter address,
      sequence control logic coupled to the program counter to receive the program counter addresses, the sequence control logic operating in response to sequence control instructions to select a next address and to cause the next address to be stored in the program counter, and
      instruction memory coupled to receive the program counter addresses from the program counter and coupled to the sequence control logic, the instruction memory storing sequence control instructions and operating to provide sequence control instructions to the sequence control logic in response to the program counter address, the instruction memory further storing pattern instructions and operating to provide pattern instructions to the APG in response to the program counter address, the instruction memory comprising a sequence instruction memory and a pattern instruction memory;

the sequence instruction memory being coupled to receive program counter addresses from the program counter and being coupled to the sequence control logic, the sequence instruction memory operating to store sequence control instructions and pattern instruction memory addresses and, in response to program counter addresses, to provide sequence control instructions to the sequence control logic and to provide pattern instruction memory addresses to the pattern instruction memory;

the pattern instruction memory being coupled to the sequence instruction memory to receive pattern instruction memory addresses from the sequence instruction memory, and operating to store pattern instructions and, in response to pattern instruction memory addresses, to provide pattern instructions to the APG;

an address generator coupled to receive pattern instructions from the instruction memory, the address generator operating to generate X address signals and Y address signals in response to received pattern instructions; and a data generator coupled to receive signals from the address generator and pattern instructions from the instruction memory, the data generator operating to generate data signals in response to received array signals and pattern instructions;

wherein the program counter is coupled to drive a subroutine vector memory control circuit in the circuit tester and operates to provide the program counter address to control operation of the subroutine vector memory.

3. In an algorithmic pattern generator for generating test vectors for testing circuits, a programmable sequencer comprising:

a pair of linked loop counters comprising a first loop counter and second loop counter;

a program counter storing a program counter address; and sequence control logic coupled to the program counter to receive the program counter address, the sequence control logic operating in response to sequence control instructions and including logic to:

execute a sequence control instruction to program a first initial value for the first loop counter, execute a sequence control instruction to program a second initial value for the second loop counter, and execute a sequence control instruction to loop to a target program counter address until the pair of linked loop counters is exhausted, wherein the pair counts as a cascaded counter pair with each loop counter running from the counter's programmable initial value to a final value.

4. The APG of claim 3 wherein the sequence control logic further includes logic to:

execute a sequence control instruction to loop to a target program counter address until the first loop counter is exhausted and reset the first loop counter to the first initial value after the first loop counter is exhausted; and execute a sequence control instruction to loop to a target program counter address until the second loop counter is exhausted and reset the second loop counter to the second initial value after the second loop counter is exhausted.

5. The APG of claim 4 wherein:

an instruction to loop to a target address until a loop counter is exhausted operates to test the loop counter and (i) if the loop counter is not zero, jump to the target address and decrement the loop counter, and (ii) if the loop counter is zero, reset the loop counter to its initial value and advance to a next instruction in sequence; and an instruction to loop to a target address on a pair of linked loop counters until the pair is exhausted operates to test the second loop counter in the pair and (i) if the second loop counter is not zero, jump to the target address and decrement the second loop counter, and (ii) if the second loop counter is zero, reset the second loop counter to its initial value and loop to the target address until the first loop counter is exhausted.

6. The APG of claim 4 wherein:

the sequencer includes at least eight loop counters including at least two pair of linked loop counters.

7. In an algorithmic pattern generator (APG) for generating test vectors for testing circuits, an address generator comprising:

registers operating to store Y-related values, including:
a Y register and a YI register, the YI register operating as an index register to the Y register,
a YREF register and a YRI register, the YRI register operating as an index register to the YREF register,
a YMAX register, and
a YOFF register;

Y address circuitry coupled to the Y, YI, YREF, YRI, YMAX and YOFF registers, the circuitry operating to perform arithmetic and logical operations on the Y, YI, YREF, YRI registers, the result of each operation being masked by the YMAX value from the YMAX register before being stored in the Y, YI, YREF, or YRI registers; and a YOFF adder coupled to the YOFF register and the Y register and operating to compute the Y address as the sum of the YOFF value and the Y value.

8. The address generator of claim 7 further comprising:

registers operating to store X-related values, including:
an X register and an XI register, the XI register operating as an index register to the X register,
an XREF register and an XRI register, the XRI register operating as an index register to the XREF register,
an XMAX register, and
an XOFF register;

X address circuitry coupled to the X, XI, XREF, XRI, XMAX and XOFF registers, the circuitry operating to perform arithmetic and logical operations on the X, XI, XREF, XRI registers, the result of each operation being masked by the XMAX value from the XMAX register before being stored in the X, XI, XREF, or XRI registers; and an XOFF adder coupled to the XOFF register and the X register and operating to compute the X address as the sum of the XOFF value and the X value.

9. In an algorithmic pattern generator for generating test vectors for testing circuits, a programmable sequencer comprising:

a program counter storing a program counter address;

sequence control logic coupled to the program counter to receive the program counter addresses, the sequence control logic operating in response to sequence control instructions to select a next address and to cause the next address to be stored in the program counter;

instruction memory coupled to receive the program counter addresses from the program counter and coupled to the sequence control logic, the instruction memory storing sequence control instructions and operating to provide sequence control instructions to the sequence control logic in response to the program counter address;

a refresh circuit coupled to the sequence control logic, the refresh circuit operating to generate a refresh interrupt signal at a timed interval and to provide the refresh interrupt signal to the sequence control logic, the sequence control logic operating to call a refresh subroutine in instruction memory in response to the refresh interrupt signal.

10. The sequencer of claim 9 wherein the refresh circuit comprises:

a counter circuit having a terminal for receiving a clocking signal and operating to count from an initial value to a final value in response to the clocking signal and to generate the refresh interrupt signal when the final value is reached.

11. The sequencer of claim 9 wherein the refresh circuit has a terminal for receiving an inhibit signal generated by an instruction executed in response to the sequencer program counter, the inhibit signal causing the refresh subroutine call to be deferred while the inhibit signal is present.

12. In an algorithmic pattern generator (APG) for generating test vectors for testing circuits, a data generator comprising:

a first stage circuit connected to receive as input address signals and operating to produce an invert value;

a crosspoint multiplexer circuit connected to receive as input address signals a number M of address signals and operating to produce as outputs output address signals being a selection of a smaller number m of the input address signals;

a topology memory connected to be addressed by the selection of m signals produced as output by the crosspoint multiplexer circuit, the topology memory producing a topology invert bit as output; and a sequence of stages through which the invert value passes serially, an input to the sequence being the output of the first stage circuit, the sequence including as one stage a data inversion gate connected to the topology memory to receive the topology invert bit and operating to invert the invert value according to the state of the topology invert bit.

13. The data generator of claim 12 wherein:

the topology memory is a $2^m \times 1$ random access memory.

14. The data generator of claim 12 wherein:

the number M is at least 36 and the number m is at least 6.

15. The data generator of claim 12 further comprising:

a latched inversion register coupled to respond to pattern instructions to set and to clear the register, the register providing as output a latched inversion bit;

wherein the sequence of stages further includes a stage having a data inversion gate connected to the latched inversion register to receive the latched inversion bit and operating to invert the invert value according to the state of the latched inversion bit.

16. The data generator of claim 12 wherein the sequence of stages further includes:

a delayed access pipeline stage coupled to respond to a DGEN instructions to set a delay length, the delayed access pipeline receiving input data including an invert value and producing as output the input data delayed by a number of APG cycles equal to the delay length;

a delay bypass data path bypassing the delayed access pipeline; and wherein both the output of the delayed access pipeline and the output of the delay bypass data path are provided to an output stage of the data generator.

17. The data generator of claim 16 wherein the delay length is selectable in a range including values from zero to seven.

18. The data generator of claim 16 wherein input to the delayed access pipeline also includes a shift register control bit and the output of the delayed access pipeline includes the shift register control bit delayed by the delay length.

* * * * *